US012369280B2

(12) United States Patent
Chen

(10) Patent No.: US 12,369,280 B2
(45) Date of Patent: Jul. 22, 2025

(54) WIRELESS SIGNAL RECEIVING CIRCUIT AND SYSTEM

(71) Applicant: GETAC TECHNOLOGY CORPORATION, New Taipei (TW)

(72) Inventor: Kuan-Yu Chen, Taipei (TW)

(73) Assignee: GETAC TECHNOLOGY CORPORATION (TW)

( * ) Notice: Subject to any disclaimer, the term of this patent is extended or adjusted under 35 U.S.C. 154(b) by 421 days.

(21) Appl. No.: 18/098,648

(22) Filed: Jan. 18, 2023

(65) Prior Publication Data

US 2023/0403034 A1 Dec. 14, 2023

Related U.S. Application Data

(60) Provisional application No. 63/351,425, filed on Jun. 12, 2022.

(51) Int. Cl.
*H04B 1/00* (2006.01)
*G06F 1/20* (2006.01)
(Continued)

(52) U.S. Cl.
CPC ......... *H05K 7/20481* (2013.01); *G06F 1/203* (2013.01); *G06K 19/0723* (2013.01); *H01Q 1/02* (2013.01); *H04B 1/0057* (2013.01); *H04B 1/16* (2013.01); *H04B 5/72* (2024.01); *H04B 5/73* (2024.01); *H05K 1/0203* (2013.01)

(58) Field of Classification Search
CPC .... H04B 1/005; H04B 1/0053; H04B 1/0057; H04B 1/16; H04B 1/38; H04B 1/3827; H04B 1/3833; H04B 1/40; H04B 5/43; H04B 5/72; H04B 5/73; H05K 1/0203; H05K 7/20481; G06F 1/0203; G06F 19/0723; H01Q 1/00; H01Q 1/02
See application file for complete search history.

(56) References Cited

U.S. PATENT DOCUMENTS 9,331,835 B1 * 5/2016 Lee ..................... H04B 1/0057
9,484,631 B1 * 11/2016 Napoles ................ H01Q 1/243
(Continued)

FOREIGN PATENT DOCUMENTS

CN 110022160 A 7/2019
KR 101280127 B1 6/2013

*Primary Examiner* — Quochien B Vuong
(74) *Attorney, Agent, or Firm* — Andy M. Han; Han IP PLLC

(57) ABSTRACT

A wireless signal receiving circuit includes: an antenna structure, for receiving a wireless reception signal in a plurality of frequency bands; a first diplexer, connected to the antenna structure, for splitting the wireless reception signal into a first wireless signal in a low frequency band and a second wireless signal in a high frequency band; a first extractor, coupled to the first diplexer, for receiving the first wireless signal and splitting the first wireless signal into a third wireless signal and a fourth wireless signal; a second diplexer, coupled to the antenna structure and connected to the first extractor, for combining the wireless reception signal and the third wireless signal into a fifth wireless signal; and a third diplexer, coupled to the first extractor and the first diplexer, for combining the second wireless signal and the fourth wireless signal into a sixth wireless signal.

11 Claims, 2 Drawing Sheets

(51) Int. Cl.
*G06K 19/07* (2006.01)
*H01Q 1/02* (2006.01)
*H04B 1/16* (2006.01)
*H04B 5/72* (2024.01)
*H04B 5/73* (2024.01)
*H05K 1/02* (2006.01)
*H05K 7/20* (2006.01)

(56) References Cited

U.S. PATENT DOCUMENTS

| | | | |
|---|---|---|---|
| 10,257,119 B2 * | 4/2019 | Wloczysiak | H04B 1/0057 |
| 11,158,957 B1 | 10/2021 | Kruger et al. | |
| 12,068,766 B2 * | 8/2024 | Yoon | H04B 1/0458 |
| 2018/0063031 A1 | 3/2018 | Wloczysiak et al. | |
| 2018/0331714 A1 | 11/2018 | See et al. | |
| 2019/0044548 A1 | 2/2019 | Freisleben | |
| 2019/0305831 A1 | 10/2019 | Freisleben et al. | |
| 2020/0162114 A1 | 5/2020 | King et al. | |
| 2022/0385337 A1 | 12/2022 | Freisleben et al. | |

* cited by examiner

WIRELESS SIGNAL RECEIVING CIRCUIT AND SYSTEM

The application claims priority to U.S. Provisional Application No. 63/351,425, filed on Jun. 12, 2022, the disclosure of which is hereby incorporated by reference herein in its entirety.

BACKGROUND OF THE INVENTION

Field of the Invention

The present invention relates to a wireless signal receiving circuit and system and, more particularly, to a wireless signal receiving circuit and system that receive a wireless signal in different frequency bands by an antenna structure and output the wireless signal to a wireless network module.

Description of the Prior Art

Accompanied with the evolving wireless network technologies, the number of antennas in a wireless signal receiving device such as a mobile device also increases.

For example, the number of antennas in a current mobile device has increased from two for the wireless wide area network long-term evolution (LTE) to four for the 5G new radio (NR).

However, limited by the size of a mobile device, how to place a multi-antenna structure into a wireless signal receiving device has become one issue to be solved in the industry.

SUMMARY OF THE INVENTION

In view of the above, the present invention provides a wireless signal receiving circuit and system, which is capable of receiving a wireless signal in multiple different frequency bands by an antenna structure (alternatively speaking, a wireless signal receiving structure), processing the wireless signal in different frequency bands by signal processing such as signal extraction, signal removal, signal splitting, noise filtering and signal amplification, and feeding the processed wireless signal to a wireless network module according to the module requirements, thereby reducing the space occupied by antennas used for receiving wireless signals.

A wireless signal receiving circuit provided by the present invention includes: an antenna structure, for receiving a wireless reception signal in a plurality of frequency bands; a first diplexer, connected to the antenna structure, for splitting the wireless reception signal into a first wireless signal in a low frequency band and a second wireless signal in a high frequency band; a first extractor, coupled to the first diplexer, for receiving the first wireless signal and splitting the first wireless signal into a third wireless signal and a fourth wireless signal; a second diplexer, coupled to the antenna structure and connected to the first extractor, for combining the wireless reception signal and the third wireless signal into a fifth wireless signal; and a third diplexer, coupled to the first extractor and the first diplexer, for combining the second wireless signal and the fourth wireless signal into a sixth wireless signal.

In one embodiment of the present invention, the antenna structure of the above wireless signal receiving circuit includes a co-constructed antenna structure, which includes a plurality of antennas.

In one embodiment of the present invention, the above wireless signal receiving circuit further includes: a noise filtering circuit, connected to the first diplexer and the first extractor, for receiving the first wireless signal.

In one embodiment of the present invention, the noise filtering circuit of the above wireless signal receiving circuit includes a second extractor, a third extractor and a low-noise amplifier.

In one embodiment of the present invention, the above wireless signal receiving circuit further includes: a fourth extractor, connected to the first diplexer, the second diplexer and the third diplexer, for receiving the second wireless signal.

A wireless signal receiving system provided by the present invention includes a wireless signal receiving device and at least one wireless network module. The wireless signal receiving device includes: an antenna structure, for receiving a wireless reception signal in a plurality of frequency bands; a first diplexer, connected to the antenna structure, for splitting the wireless reception signal into a first wireless signal in a low frequency band and a second wireless signal in a high frequency band; a first extractor, coupled to the first diplexer, for receiving the first wireless signal and splitting the first wireless signal into a third wireless signal and a fourth wireless signal; a second diplexer, coupled to the antenna structure and connected to the first extractor, for combining the wireless reception signal and the third wireless signal into a fifth wireless signal; and a third diplexer, coupled to the first extractor and the first diplexer, for combining the second wireless signal and the fourth wireless signal into a sixth wireless signal. The at least one wireless network module is for receiving a wireless signal from the wireless signal receiving device.

In one embodiment of the present invention, in the above wireless signal receiving system, the antenna structure of the wireless signal receiving device includes a co-constructed antenna structure, which includes a plurality of antennas.

In one embodiment of the present invention, in the above wireless signal receiving system, the wireless signal receiving device further includes: a noise filtering circuit, connected to the first diplexer and the first extractor, for receiving the first wireless signal.

In one embodiment of the present invention, in the above wireless signal receiving system, the noise filtering circuit includes a second extractor, a third extractor and a low-noise amplifier.

In one embodiment of the present invention, in the above wireless signal receiving system, the wireless signal receiving device further includes: a fourth extractor, connected to the first diplexer, the second diplexer and the third diplexer, for receiving the second wireless signal.

In one embodiment of the present invention, in the above wireless signal receiving system, the wireless network module includes a wireless wide area network (WWAN) module and a wireless local area network (WLAN) module.

In conclusion, the present invention is capable of receiving a wireless signal in multiple different frequency bands by an antenna structure (alternatively speaking, a wireless signal receiving structure), processing the wireless signal in different frequency bands by signal processing such as signal extraction, signal removal, signal splitting, noise filtering and signal amplification, and feeding the processed wireless signal to a wireless network module according to the module requirements, thereby reducing the space occupied by antennas used for receiving wireless signals.

To better understand the above and other objects, features and advantages of the present invention, preferred embodiments are described in detail with the accompanying drawings below.

DETAILED DESCRIPTION OF THE EMBODIMENTS

Figure 1:
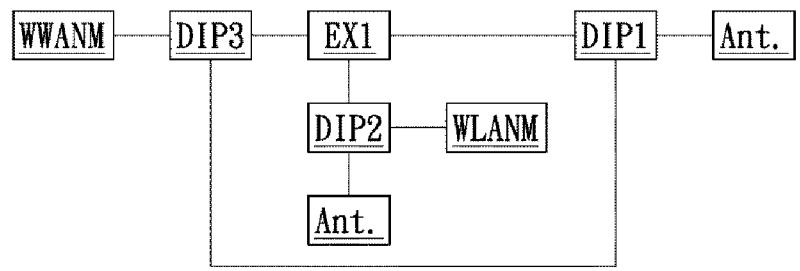
FIG. 1 is a block diagram of a wireless signal receiving system provided according to an embodiment of the present invention.

Referring to FIG. 1, FIG. 1 shows a block diagram of a wireless signal receiving system provided according to an embodiment of the present invention.

In this embodiment, a wireless signal receiving system 1 of the present invention includes a wireless signal receiving device and at least one wireless network module. The wireless signal receiving device includes a wireless signal receiving circuit, and is connected to the at least one wireless network module (for example, the wireless network module may include a wireless wide area network module WWANM and a wireless local area network module WLANM).

In this embodiment, the wireless signal receiving circuit includes an antenna structure Ant., a first diplexer DIP1, a first extractor EX1, a second diplexer DIP2 and a third diplexer DIP3. The antenna structure Ant. is connected to the first diplexer DIP1 and the second diplexer DIP2. The first extractor EX1 is connected to the first diplexer DIP1, the second diplexer DIP2 and the third diplexer DIP3. The third diplexer DIP3 is connected to the first diplexer DIP1 and the wireless wide area network module WWANM. The second diplexer DIP2 is connected to the wireless local area network module WLANM.

To avoid being unclear or causing ambiguity, some terms used in the present invention are first explained herein. In addition, to prevent overly long description, devices or structures having the same functions are denoted by the same numerals or symbols in the embodiments.

In the present invention, an antenna structure refers to a device for transmitting or receiving wireless signals. More particularly, an antenna structure may be an independent device exclusively for transmitting or receiving wireless signals, or may be a unit of metal appearing as a specific shape. Any antenna structure capable of transmitting or receiving wireless signals may be implemented as the antenna structure of the present invention, and the present invention does not limit the specific implementation form of the antenna structure.

In the present invention, the antenna structure may include a co-constructed antenna structure, which may include a plurality of antennas. Such co-constructed antenna structure refers to a structure that transmits or receives wireless signals in a plurality of different frequency bands by one single antenna structure. In general, one single antenna structure is usually used to transmit or receive wireless signals in a specific frequency; a co-constructed antenna structure, for wireless signals in a plurality of different frequency bands originally needed to be transmitted or received respectively by a plurality of antenna structures, is capable of transmitting or receiving the wireless signals in a plurality of different frequency bands by means of a shared structure, and is hence referred to as a co-constructed antenna. In addition, any structure or device capable of transmitting or receiving wireless signals in a plurality of frequency bands by the shared structure may be implemented as the co-constructed antenna structure of the present invention, and the present invention does not limit the specific implementation form of the co-constructed antenna structure.

Figure 2:
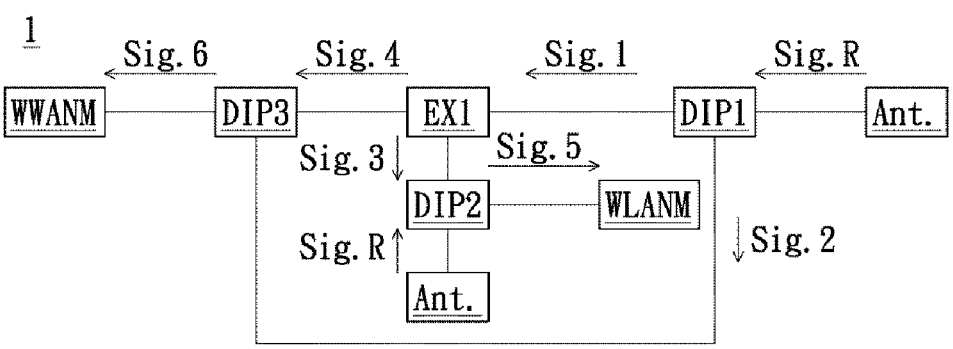
FIG. 2 is a schematic diagram of directions of wireless signals in a wireless signal receiving system provided according to an embodiment of the present invention.

Next, referring to FIG. 2, FIG. 2 shows a schematic diagram of directions of wireless signals in a wireless signal receiving system provided according to an embodiment of the present invention.

Take an MIMO2 wireless signal and Wi-Fi 2.4G/5G/6G wireless signals for example. The wireless signal receiving system 1 of the present invention is capable of receiving, by the co-constructed antenna structure of the antenna structure Ant., a wireless reception signal Sig.R (that is, the above MIMO2 wireless signal and the Wi-Fi 2.4G/5G/6G wireless signals) in a plurality of frequency bands. The MIMO2 and Wi-Fi 2.4G wireless signals and Wi-Fi 5G/6G wireless signals are received by a dual-antenna structure serving as the co-constructed antenna structure (that is, the dual-antenna structure may be used as an antenna structure that receives MIMO2 and Wi-Fi 2.4G wireless signals, or may be used as an antenna structure that receives Wi-Fi 5G and Wi-Fi 6G wireless signals). Next, the first diplexer DIP1 splits the wireless reception signal Sig.R into a first wireless signal Sig.1 in a low frequency band (for example, in a frequency band of 698 M to 2690 M Hz), and a second wireless signal Sig.2 in a high frequency band (for example, in a frequency band of 3300 M to 5000 M Hz). Then, the first extractor EX1 receives the first wireless signal Sig.1, and splits the first wireless signal Sig.1 into a third wireless signal Sig.3 (in a frequency band of 2401 M to 2495 M Hz, for example) and a fourth wireless signal Sig.4 (in a frequency band of 698 M to 2690 M Hz but excluding the frequency band of 2401 M to 2495 M Hz, for example). The second diplexer DIP2 combines the wireless reception signal Sig.R (in a frequency band of 5180 M to 7150 M Hz, for example) and the third wireless signal Sig.3 into a fifth wireless signal Sig.5, and feeds the fifth wireless signal Sig.5 into the wireless network module (for example, the wireless local area network module WLANM of the Wi-Fi module). Then, the third diplexer DIP3 combines the second wireless signal Sig.2 and the fourth wireless signal Sig.4 into a sixth wireless signal Sig.6, and feeds the sixth wireless signal Sig.6 into the wireless network module (for example, the wireless wide area network module WWANM).

The first diplexer DIP1 included in the wireless signal receiving system 1 of the present invention is connected to the antenna structure Ant., the first extractor EX1 and the third diplexer DIP3, and is for splitting the wireless reception signal Sig.R into the first wireless signal Sig.1 in a low frequency band and the second wireless signal Sig.2 in a high frequency band, and transmitting the first wireless signal Sig.1 in a low frequency band to the first extractor EX1 and the second wireless signal Sig.2 in a high frequency band to the third diplexer DIP3. In this embodiment, the low frequency band split by the first diplexer DIP1 is 698 M to 2690 M Hz and the high frequency band is 3300 M to 5000 M Hz; however, the present invention is not limited to the above examples.

The first extractor EX1 included in the wireless signal receiving system 1 of the present invention is connected to the first diplexer DIP1, the second diplexer DIP2 and the third diplexer DIP3, and is for receiving the first wireless signal Sig.1, splitting the first wireless signal Sig.1 into the third wireless signal Sig.3 and the fourth wireless signal Sig.4, and transmitting the third wireless signal Sig.3 to the second diplexer DIP2 and the fourth wireless signal Sig.4 to the third diplexer DIP3. In this embodiment, the frequency bands split by the first extractor EX1 are 2401 M to 2495 M Hz and 698 M to 2690 M Hz but excluding the frequency band of 2401 M to 2495 M Hz; that is, the fourth wireless signal Sig.4 does not include the frequency band of the third wireless signal Sig.3; however, the present invention is not limited to the above examples.

The second diplexer DIP2 included in the wireless signal receiving system 1 of the present invention is connected to the first extractor EX1, the antenna structure Ant. and the wireless local area network module WLANM, and is for combining the wireless reception signal Sig.R and the third wireless signal Sig.3 into the fifth wireless signal Sig.5, and feeding the fifth wireless signal Sig.5 into the wireless local area network module WLANM. In this embodiment, the frequency band of the wireless reception signal Sig.R is 5180 M to 7150 M Hz, and the frequency band of the third wireless signal Sig.3 is 2401 to 2495 M Hz; however, the present invention is not limited to the above examples.

The third diplexer DIP3 included in the wireless signal receiving system 1 of the present invention is connected to the first extractor EX1, the first diplexer DIP1 and the wireless wide area network module WWANM, and is for combining the second wireless signal Sig.2 and the fourth wireless signal Sig.4 into the sixth wireless signal Sig.6, and feeding the sixth wireless signal Sig.6 into the wireless wide area network module WWANM. In this embodiment, the frequency band of the second wireless signal Sig.2 is 3300 M to 5000 M Hz, and the frequency band of the fourth wireless signal Sig.4 is 698 M to 2690 M Hz but excluding the frequency band of 2401 M to 2495 M Hz; however, the present invention is not limited to the above examples.

Figure 3:
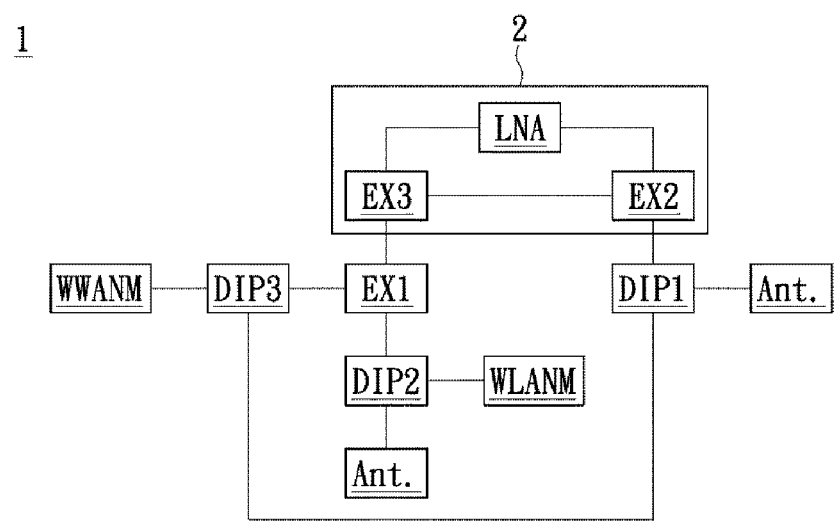
FIG. 3 is a block diagram of a wireless signal receiving system provided according to another embodiment of the present invention.

Referring to FIG. 3, FIG. 3 shows a block diagram of a wireless signal receiving system provided according to another embodiment of the present invention.

In this embodiment, the wireless signal receiving system 1 of the present invention further includes a noise filtering circuit 2 for receiving the first wireless signal Sig.1. The noise filtering circuit 2 includes a second extractor EX2, a third extractor EX3 and a low-noise amplifier LNA. The second extractor EX2 is connected to the first diplexer DIP1, the third extractor EX3 and the low-noise amplifier LNA. The third extractor EX3 is connected to the low-noise amplifier LNA and the first extractor EX1. The second extractor EX2 receives the first wireless signal Sig.1 and splits the first wireless signal Sig.1 into a wireless signal in a frequency band of 1166 M to 1187 M Hz, and a wireless signal in a frequency band of 698 M to 2690 M Hz but excluding 1166 M to 1187 M Hz, and transmits the wireless signal in the frequency band of 1166 M to 1187 M Hz to the low-noise amplifier LNA and the wireless signal in the frequency band of 698 M to 2690 M Hz but excluding 1166 M to 1187 M Hz to the third extractor EX3. Then, the third extractor EX3 combines and transmits the wireless signals to the first extractor EX1, so as to filter out the noise from the first wireless signal Sig.1 and enhance signal quality as well as signal stability.

Figure 4:
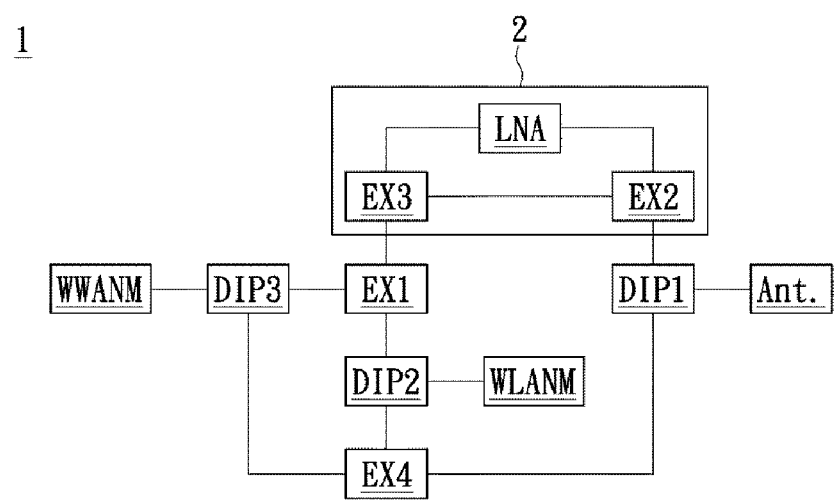
FIG. 4 is a block diagram of a wireless signal receiving system provided according to yet another embodiment of the present invention.

Referring to FIG. 4, FIG. 4 shows a block diagram of a wireless signal receiving system provided according to yet another embodiment of the present invention.

In this embodiment, the wireless signal receiving system 1 of the present invention further includes a fourth extractor EX4. The fourth extractor EX4 is connected to the first diplexer DIP1, the second diplexer DIP2 and the third diplexer DIP3.

In this embodiment, the antenna structure Ant. can be used to receive wireless wide area network (WWAN) and Wi-Fi wireless signals. The fourth extractor EX4 can be used to receive the second wireless signal Sig.2, split the second wireless signal Sig.2 into a wireless signal in a frequency band of 5180 M to 7150 M Hz and a wireless signal in a frequency band of 3300 M to 5000 M Hz, and transmit the wireless signal in the frequency band of 5180 M to 7150 M Hz to the second diplexer DIP2 and the wireless signal in the frequency band of 3300 M to 5000 M Hz to the third diplexer DIP3. The second diplexer DIP2 and the third diplexer DIP3 then feed the wireless signals into the wireless network module.

In conclusion, the present invention is capable of receiving a wireless signal in multiple different frequency bands by an antenna structure (alternatively speaking, a wireless signal receiving structure), processing the wireless signal in different frequency bands by signal processing such as signal extraction, signal removal, signal splitting, noise filtering and signal amplification, and feeding the processed wireless signal to a wireless network module according to the module requirements, thereby reducing the space occupied by antennas used for receiving wireless signals.

The present invention is disclosed by the embodiments above. However, these embodiments are not to be construed as limitations to the present invention. Slight modifications and variations may be made to the embodiments by a person skilled in the art without departing from the spirit and scope of the present invention. Therefore, the scope of legal protection for the present invention shall be defined by the appended claims.

What is claimed is:

1. A wireless signal receiving circuit, comprising:
   an antenna structure, for receiving a wireless reception signal in a plurality of frequency bands;
   a first diplexer, connected to the antenna structure, for splitting the wireless reception signal into a first wireless signal in a low frequency band and a second wireless signal in a high frequency band;
   a first extractor, coupled to the first diplexer, for receiving the first wireless signal and splitting the first wireless signal into a third wireless signal and a fourth wireless signal;
   a second diplexer, coupled to the antenna structure, connected to the first extractor, for combining the wireless reception signal and the third wireless signal into a fifth wireless signal; and
   a third diplexer, coupled to the first extractor and the first diplexer, for combining the second wireless signal and the fourth wireless signal into a sixth wireless signal.

2. The wireless signal receiving circuit according to claim 1, wherein the antenna structure comprises a co-constructed antenna structure, which comprises a plurality of antennas.

3. The wireless signal receiving circuit according to claim 1, further comprising:
   a noise filtering circuit, connected to the first diplexer and the first extractor, for receiving the first wireless signal.

4. The wireless signal receiving circuit according to claim 3, wherein the noise filtering circuit comprises a second extractor, a third extractor and a low-noise amplifier.

5. The wireless signal receiving circuit according to claim 1, further comprising:

a fourth extractor, connected to the first diplexer, the second diplexer and the third diplexer, for receiving the second wireless signal.

6. A wireless signal receiving system, comprising:
a wireless signal receiving device, comprising:
   an antenna structure, for receiving a wireless reception signal in a plurality of frequency bands;
   a first diplexer, connected to the antenna structure, for splitting the wireless reception signal into a first wireless signal in a low frequency band and a second wireless signal in a high frequency band;
   a first extractor, coupled to the first diplexer, for receiving the first wireless signal and splitting the first wireless signal into a third wireless signal and a fourth wireless signal;
   a second diplexer, coupled to the antenna structure, connected to the first extractor, for combining the wireless reception signal and the third wireless signal into a fifth wireless signal; and
   a third diplexer, coupled to the first extractor and the first diplexer, for combining the second wireless signal and the fourth wireless signal into a sixth wireless signal; and at least one wireless network module, connected to the wireless signal receiving device, for receiving a wireless signal from the wireless signal receiving device.

7. The wireless signal receiving system according to claim 6, wherein the antenna structure comprises a co-constructed antenna structure, which comprises a plurality of antennas.

8. The wireless signal receiving system according to claim 6, wherein the wireless signal receiving device further comprises:
   a noise filtering circuit, connected to the first diplexer and the first extractor, for receiving the first wireless signal.

9. The wireless signal receiving system according to claim 8, wherein the noise filtering circuit comprises a second extractor, a third extractor and a low-noise amplifier.

10. The wireless signal receiving system according to claim 6, wherein the wireless signal receiving device further comprises:
   a fourth extractor, connected to the first diplexer, the second diplexer and the third diplexer, for receiving the second wireless signal.

11. The wireless signal receiving system according to claim 6, wherein the at least one wireless network module comprises a wireless wide area network (WWAN) module and a wireless local area network (WLAN) module.

* * * * *